(12) United States Patent
Akimoto et al.

(10) Patent No.: US 6,702,624 B2
(45) Date of Patent: *Mar. 9, 2004

(54) ELECTRONIC COMPONENT IN WHICH AN INSERT MEMBER IS TIGHTLY HELD BY A RESIN PORTION AND PREVENTED FROM DEFORMATION THEREOF

(75) Inventors: Hiroshi Akimoto, Oume (JP); Katsumi Arai, Tachikawa (JP); Katsuma Ushijima, Tachikawa (JP); Takahiro Abe, Hino (JP)

(73) Assignee: Japan Aviation Electronic Industry, Limited, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/274,859
(22) Filed: Mar. 23, 1999

(65) Prior Publication Data
US 2001/0014559 A1 Aug. 16, 2001

(30) Foreign Application Priority Data

Mar. 7, 1998 (JP) .............................. 10-189439

(51) Int. Cl.[7] ................................................ H01R 17/00
(52) U.S. Cl. ........................................ 439/736; 439/660
(58) Field of Search ................................ 439/736, 660, 439/444, 74, 885, 603, 604, 496; 29/842, 848

(56) References Cited

U.S. PATENT DOCUMENTS

| 5,772,474 A | * | 6/1998 | Yagi et al. ................... 439/660 |
| 5,813,871 A | * | 9/1998 | Grabbe et al. ............... 439/108 |
| 5,842,875 A | * | 12/1998 | Yagi ............................. 439/74 |
| 6,004,160 A | * | 12/1999 | Korsunsky et al. .......... 439/660 |

FOREIGN PATENT DOCUMENTS

JP           7-31511         7/1995

* cited by examiner

Primary Examiner—Alexander Gilman
(74) Attorney, Agent, or Firm—Michael Best & Fried Friedrich LLP

(57) ABSTRACT

An electronic component has an insert member embedded in a resin portion by an insert molding method, with a part of the insert member exposed at an outer surface of the resin portion. At least a part of the exposed portion of the insert member is depressed relative to the outer surface of the resin portion.

3 Claims, 6 Drawing Sheets

US 6,702,624 B2

ELECTRONIC COMPONENT IN WHICH AN INSERT MEMBER IS TIGHTLY HELD BY A RESIN PORTION AND PREVENTED FROM DEFORMATION THEREOF

BACKGROUND OF THE INVENTION

The present invention relates to an electronic component such as a connector widely used in various electronic apparatus known in the art.

Generally, such an electronic component includes a resin portion and insert members assembled to the resin portion.

Referring to FIGS. 12, 13, and 14, a conventional electronic component will be described below. In the electronic component, the resin portion is designated by a reference numeral 3, each of the insert members being designated by a reference numeral 5. The insert members 5 are generally embedded simply into the resin portion 3 in an insert molding method known in the manner. Each of the insert members 5 has portions 51 and 52 which are exposed with being generally flush with an outer surface of the resin portion 3. Alternatively, the portions 51 and 52 may project from the outer surface of the resin portion 3.

The conventional electronic component has the problem that, if external forces are applied to the portions 51 and 52 of the insert member 5, the insert member 5 is deformed and, in the worst case, dropped from the resin portion 3 as shown in FIGS. 15 and 16.

An attempt was made to solve the foregoing problem as disclosed in Japanese Utility Model Examined Publication No. 7-31511, wherein a special mold is used to carry out coining (i.e. pressing like forming a coin) of portions of the insert members to form projections, so that the insert members are prevented from being deformed or dropped due to external forces, by utilizing the thus formed projections.

However, an additional step of coining is required which causes another problem of an increase in production cost. Further, the mold used for the coining has shorter duration of life, resulting in a further increase of production cost. Besides, dimensions of the insert members may be out of order due to the coining. Moreover, the small-sized connector with less pitches between the contacts (insert members) does not permit coining of the contacts because of the small pitches.

SUMMARY OF THE INVENTION

It is therefore an object of the present invention to provide an electronic component which can prevent deformation or dropping of an insert member with a simple structure.

It is another object of the present invention to provide an electronic component of a simple structure which can prevent deformation or dropping of an insert member and a dimensional error of the insert member and which can be adapted to miniaturization.

It is another object of the present invention to provide a method of producing an electronic component of a simple structure which can prevent deformation or dropping of an insert member and a dimensional error of the insert member and which can be adapted to miniaturization.

Other objects of the present invention will become clear as the description proceeds.

According to an aspect of the present invention, there is provided an electronic component which comprises a resin portion having an outer surface and an insert member embedded in the resin portion by an insert molding method, the insert member having an exposed surface which is not covered by the resin portion, the exposed surface having a portion depressed relative to the outer surface of the resin portion.

According to another aspect of the present invention, there is provided an electronic component which comprises a resin portion and an insert member embedded in the resin portion by an insert molding method, the insert member having a projection formed by a face striking process and being engaged with the resin portion by the projection.

According to still another aspect of the present invention, there is provided a method of producing an electronic component. The method comprises the steps of preparing an insert member, forming a projection on the insert member by applying a face striking process to the insert member, preparing a mold, placing the insert member into the mold, and filling resin into the mold to form a resin portion and to embed the insert member in the resin portion.

DESCRIPTION OF THE PREFERRED EMBODIMENTS

Now, preferred embodiments of the present invention will be described with reference to the accompanying drawings.

In the preferred embodiments, the present invention is applied to a connector as an electronic component.

Figure 1:
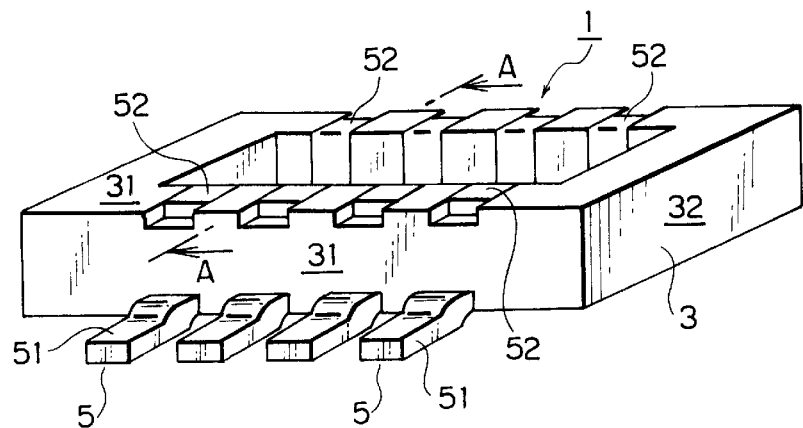
FIG. 1 is a perspective view of a connector according to a first embodiment of the present invention.
Figure 2:
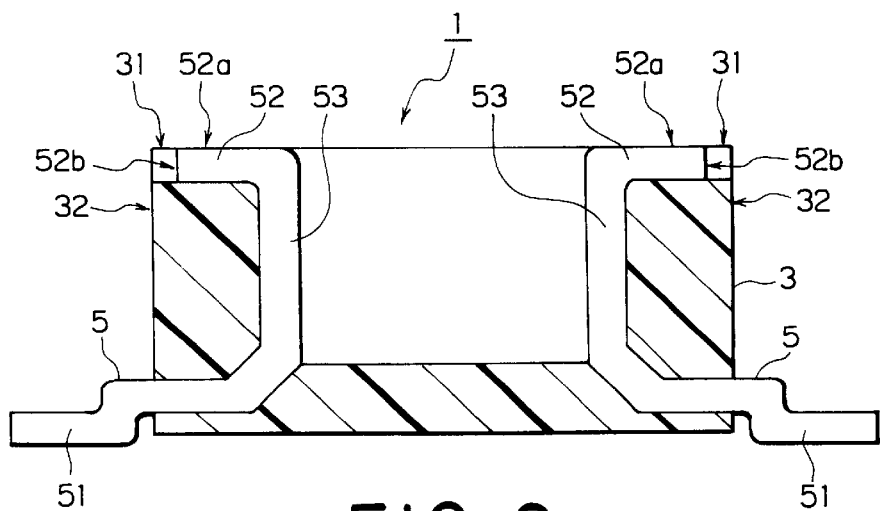
FIG. 2 is a sectional view taken along the line A—A in FIG. 1.

Referring to FIGS. 1 and 2, description will be made as regards a connector according to a first embodiment of the present invention. The connector 1 comprises an insulator 3 being a resin portion and contacts 5 being insert members. The connector 1 is mounted on a printed circuit board (not shown) so that it is engaged with and disengaged from a counterpart connector (not shown) in the directions perpendicular to a mounting surface of the printed circuit board.

The insulator 3 is essentially of a frame-like structure and is engaged with and disengaged from an insulator of the counterpart connector in the engaging/disengaging directions. Thus, one end surface of the insulator 3 in the engaging/disengaging directions has a flat engaging-side end surface 31, and an outer peripheral surface 32 which is perpendicular to the engaging-side end surface 31 is located at the outer four sides of the engaging-side end surface 31.

Each of the contacts 5 is formed by punching a metal plate into a rod and bending the rod into a U-shaped structure. The thus formed contact 5 has a terminal portion 51 which is fixed by soldering to a conductive pattern pad formed on the printed circuit board, a contact portion 52 which is contacted with a contact of the counterpart connector, and a connecting portion 53 for connection between the terminal portion 51 and the contact portion 52. The contact 5 is embedded into the insulator 3 by the insert molding method, and a contact surface 52a and a side surface 52b of the contact portion 52 of the contact 5 are exposed at the engaging-side end surface 31 and the outer peripheral surface 32 of the insulator 3, respectively. However, it should be noted that although the contact surface 52a of the contact portion 52 is flush with the engaging-side end surface 31 of the insulator 3, the side surface 52b of the contact portion 52 is depressed or recessed relative to the outer peripheral surface 32 of the insulator 3, as illustrated in FIGS. 1 and 2. This structure can restrict external forces to be applied to the side surface 52b of the contact portion 52 and consequently prevents the contact 5 from being deformed or dropped.

Figure 3:
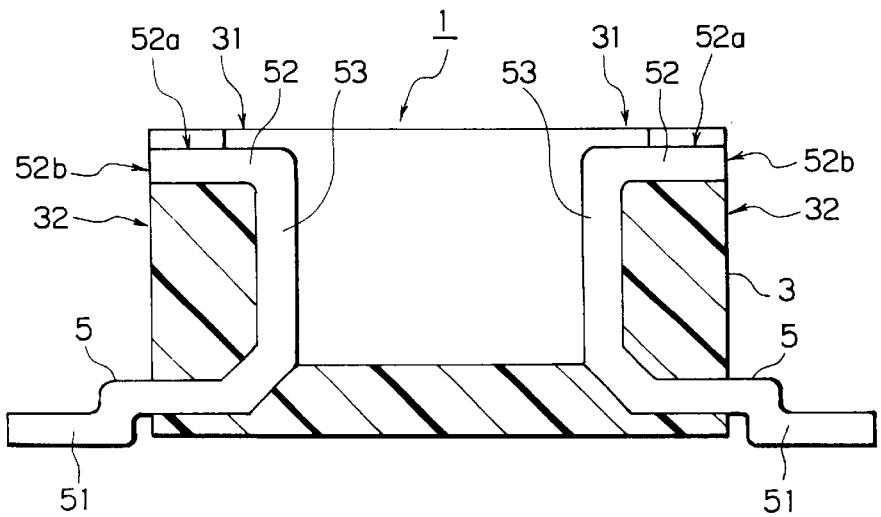
FIG. 3 is a sectional view, corresponding to FIG. 2, of a connector according to a second embodiment of the present invention.

Referring now to FIG. 3, the description will be made as regards a connector according to a second embodiment of the present invention. It is appreciated that the basic structure of the second embodiment is essentially the same as that of the foregoing first embodiment, and no description or explanation will be made with respect to the same or similar elements for the purpose of simplification by assigning the same reference signs to those elements.

In the connector 1, the side surface 52b of the contact portion 52 of the contact 5 is made flush with the outer circumferential surface 32 of the insulator 3, while the contact surface 52a of the contact portion 52 is depressed or concaved relative to the engaging-side end surface 31 of the insulator 3.

Figure 4:
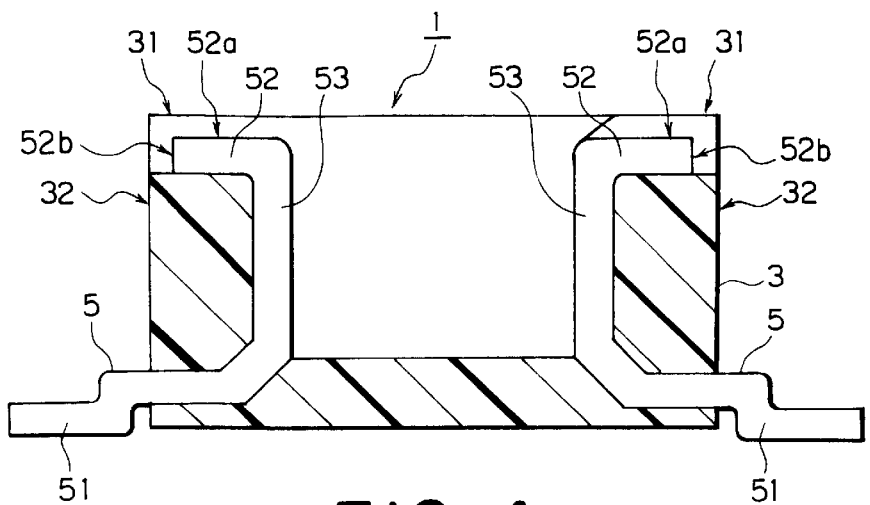
FIG. 4 is a sectional view, corresponding to FIG. 2, of a connector according to a third embodiment of the present invention.

Turning to FIG. 4, the description will be made as regards a connector according to a third embodiment of the present invention. The basic structure is essentially the same as that of the foregoing first embodiment of the present invention, and no description or explanation will be made with respect to the same or similar elements for the purpose of simplification by assigning the same reference signs to those elements.

In the connector 1, the contact surface 52a and the side surface 52b of the contact portion 52 of the contact 5 are depressed from the engaging-side end surface 31 and the outer peripheral surface 32, respectively, of the insulator 3.

Figure 5:
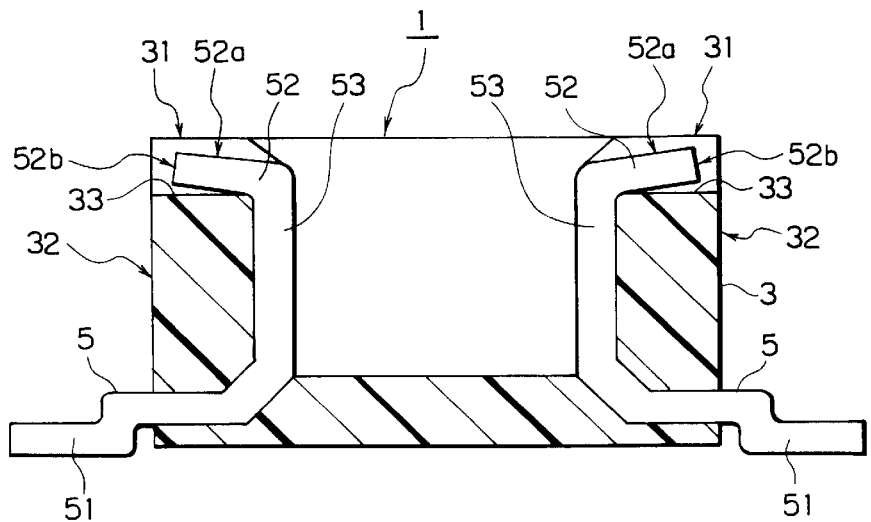
FIG. 5 is a sectional view, corresponding to FIG. 2, of a connector according to a fourth embodiment of the present invention.
Figure 6:
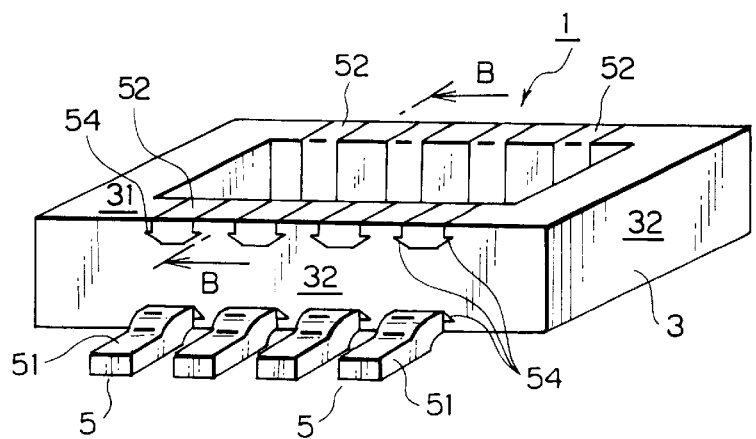
FIG. 6 is a perspective view of a connector according to a fifth embodiment of the present invention.
Figure 7:
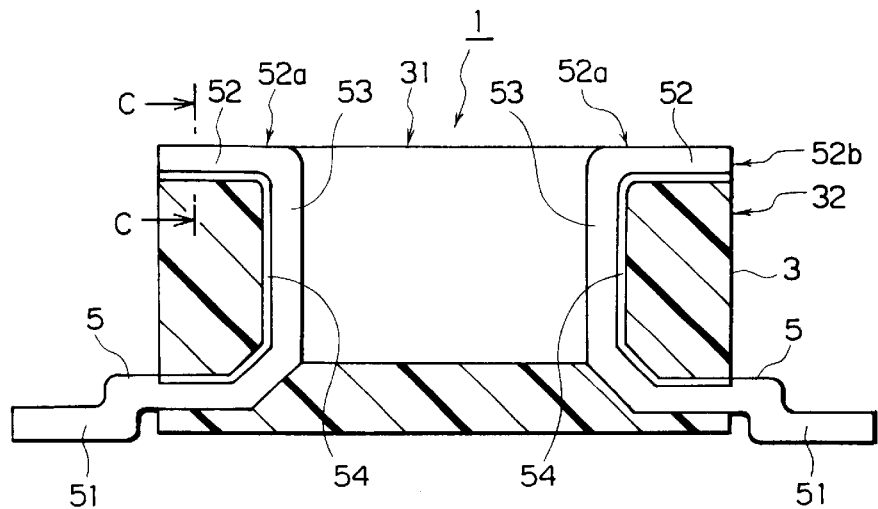
FIG. 7 is a sectional view taken along the line B—B in FIG. 6.
Figure 8:
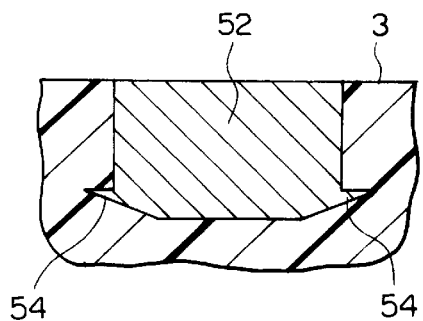
FIG. 8 is an enlarged sectional view taken along the line C—C in FIG. 7.
Figure 9:
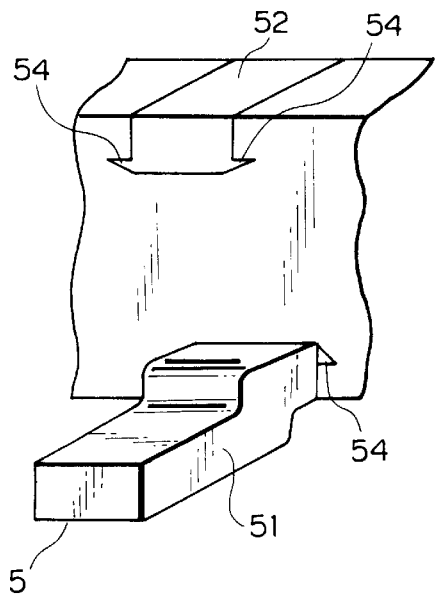
FIG. 9 is a perspective view showing the main part of the connector shown in FIG. 6.

Turning to FIG. 5, the description will be made as regards a connector according to a fourth embodiment of the present invention. The basic structure is essentially the same as that of the foregoing first embodiment of the present invention, and no description or explanation will be made with respect to the same or similar elements for the purpose of simplification by assigning the same reference signs to those elements.

In the connector 1, the contact surface 52a and the side surface 52b of the contact portion 52 of the contact 5 are depressed from the engaging-side end surface 31 and the outer peripheral surface 32, respectively, of the insulator 3 and, moreover, the contact portion 52 of the contact 5 is raised from a bottom surface of a groove 33 of the insulator 3. This provides a suitable resiliency to the contact portion 52 of the contact 5 and assures a reliable contact relative to the counterpart connector.

With reference to FIGS. 6 to 9, the description will be made as regards a fifth embodiment of the present invention. The basic structure of the fifth embodiment is essentially the same as that of the foregoing first embodiment, and no description or explanation will be made with respect to the same or similar elements for the purpose of simplification by assigning the same reference signs to those elements.

The connector 1 differs from the foregoing first to fourth embodiments in that the contact surface 52a and the side surface 52b of the contact portion 52 of the contact 5 are not depressed relative to the engaging-side end surface 31 and the outer peripheral surface 32 of the insulator 3. Instead, in the connector, the contact 5 has projections 54. Each of the projections 54 serves as a hook or engagement relative to the insulator 3 after the insert molding and, by the engagement of the projections 54 relative to the insulator 3, the contact 5 is prevented from coming off the insulator 3 and being deformed. The projections 54 are made by a known face striking process.

Now, a method of producing the connector 1 according to this embodiment will be described. First, a metal plate is punched to obtain rod-like contact elements which are connected together by a carrier.

Subsequently, deburring is made by a press machine and a punching machine. During the deburring step, a plate is pushed against both-side edge portions of one surface of the contact element and pressed by means of a press machine to carry out a face striking process relative to the contact element to thereby form the projections 54. The deburring is unavoidable and the chamfering is simultaneously conducted with the deburring step, so that any special mold as required in the coining step is not required. Therefore, an increase in production costs due to an increase in production steps and due to consumption of molds can be avoided. Further, the face striking process causes substantially no dimensional error to the contact element.

Subsequently, the contact elements are bent to a U-shaped structure so that a plurality of contacts 5 which are connected to the carrier are obtained.

Subsequently, the contacts 5 connected to the carrier are placed in position in the mold, then the mold is closed, and then resin is filled into the mold to thereby accomplish the insert molding. After the insulator 3 is formed by the insert molding, a finishing step is carried out by releasing the carrier from the contacts 5 and so forth.

Through the foregoing processes, the connector 1 having the contacts 5 embedded in the insulator 3 is obtained.

Figure 10:
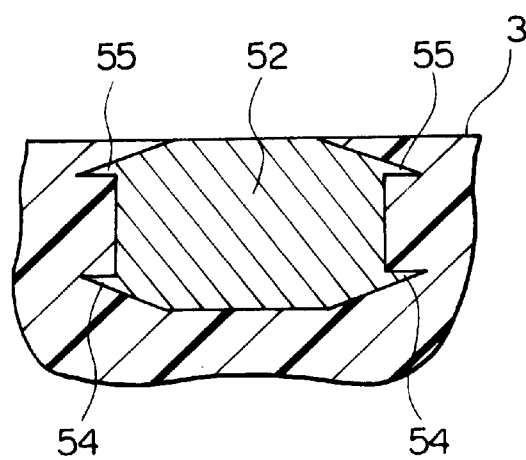
FIG. 10 is an enlarged sectional view, corresponding to FIG. 8, of a connector according to a sixth embodiment of the present invention.
Figure 11:
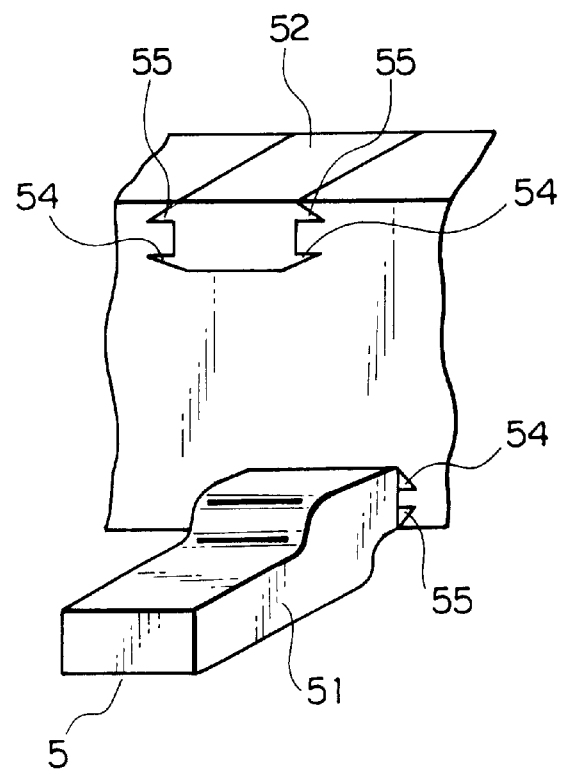
FIG. 11 is a perspective view showing the main part of the connector shown in FIG. 10.
Figure 12:
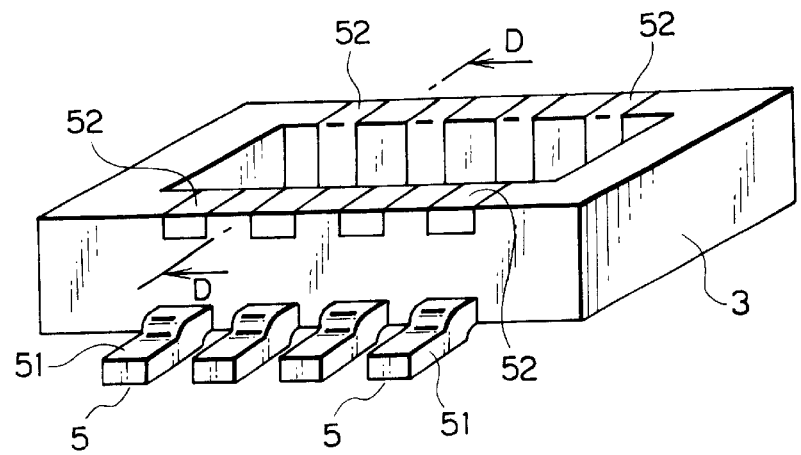
FIG. 12 is a perspective view of a conventional electronic component.
Figure 13:
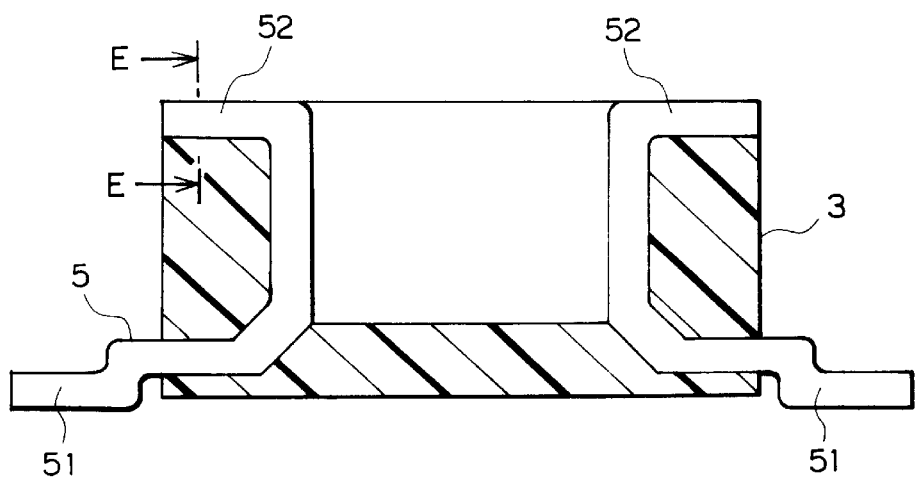
FIG. 13 is a sectional view taken along the line D—D in FIG. 12.
Figure 14:
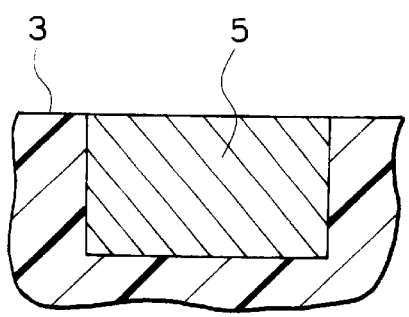
FIG. 14 is a sectional view taken along the line E—E in FIG. 13.
Figure 15:
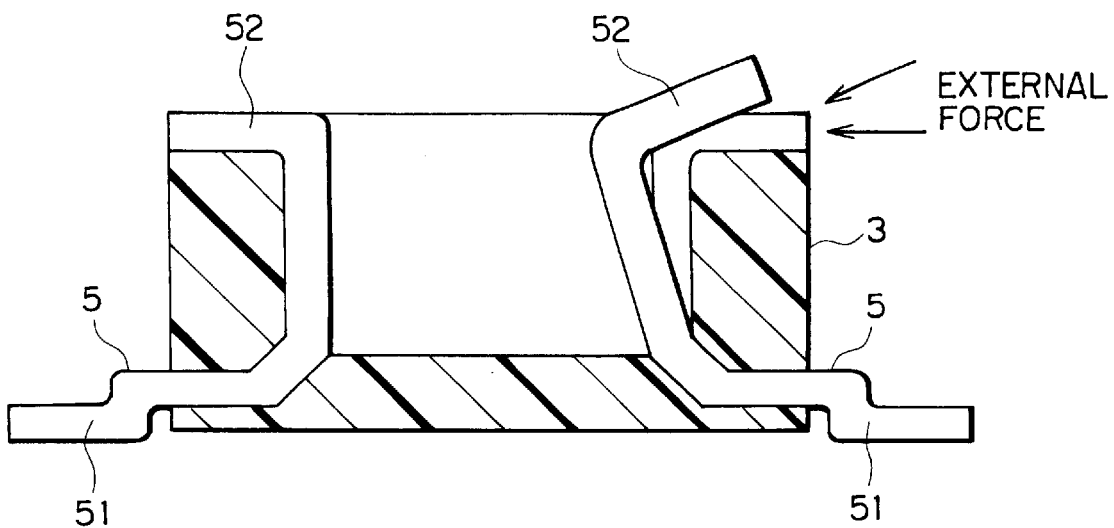
FIG. 15 is a sectional view corresponding to FIG. 13, wherein an insert member of the electronic component shown in FIG. 12 is deformed due to external forces.
Figure 16:
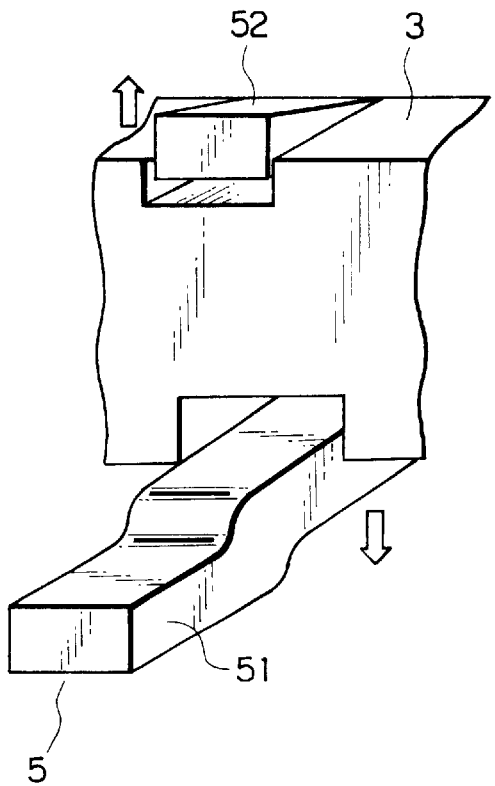
FIG. 16 is a perspective view showing the main part of the electronic component shown in FIG. 12, wherein insert members are deformed due to external forces.

With reference to FIGS. 10 and 11, the description will be made as regards a connector according to a sixth embodiment of the present invention. The basic structure of the sixth embodiment is essentially the same as that of the foregoing fifth embodiment, and no description or explanation will be made with respect to the same or similar elements for the purpose of simplification by assigning the same reference signs to those elements.

Specifically, in this embodiment, projections 54, 55 formed by the face striking process are provided-on the opposite sides of the contact 5. This assures further prevention of deformation and dropping of the contact.

According to the electronic components of the foregoing embodiments, it is possible, with the simple structure, to prevent the insert members from being deformed or dropped. Particularly, in case of the electronic component having the projections formed on the insert members by the face striking process, the reliability of prevention of deformation and dropping of the insert members can be increased without any sacrifice of production costs and accuracy of the dimensions.

While the present invention has thus far been described in connection with a few embodiments thereof, it will readily be possible for those skilled in the art to put this invention into practice in various other manners. For example, the present invention is applicable to any electronic component as long as it includes a resin portion and an insert member. It may be arranged that the feature of the first to fourth embodiments in which at least a portion of the exposed surface of the insert member is depressed from the outer surface of the resin portion is combined with the feature of the fifth and sixth embodiments in which the insert member is formed with the projections by the face striking process.

What is claimed is:

1. An electronic component comprising:

a resin portion having an outer end surface and an outer peripheral surface perpendicular to said end surface; and a conductive insert member having a projecting horn extending from and along a side thereof, said projecting horn being embedded in said resin portion by an insert molding method, said insert member having a contact surface and a side surface, whereby said projection prevents said contact from separating from said resin and from being deformed, said contact surface and said side surface continuously extend along said end surface and said outer peripheral surface, respectively, said contact surface and said side surface extending along said end surface and said outer peripheral surface of the resin portion responsive to said insert molding method, respectively, both said contact surface and said side surface being exposed to an outside of said electronic component without being covered by said resin portion.

2. The electronic component according to claim 1, wherein said resin portion is formed as an insulator included in a connector, said insert member being formed as a conductive contact which is included in said connector and held by said insulator, said connector being releasably engaged with a counterpart connector in a predetermined direction.

3. The electronic component according to claim 2, wherein said end surface is at an end of said insulator in said predetermined direction, said outer peripheral surface extending in said predetermined direction, said conductive contact including a contact portion which is exposed at said surface and at said outer peripheral surface to form said exposed surface.

\* \* \* \* \*